United States Patent
Bhagwagar et al.

(10) Patent No.: US 6,433,057 B1
(45) Date of Patent: Aug. 13, 2002

(54) SILICONE COMPOSITION AND ELECTRICALLY CONDUCTIVE SILICONE ADHESIVE FORMED THEREFROM

(75) Inventors: Dorab Edul Bhagwagar, Saginaw; Don Lee Kleyer, Hemlock; Michael Andrew Lutz, Hope, all of MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 09/536,845

(22) Filed: Mar. 28, 2000

(51) Int. Cl.[7] .................................................. C08K 3/10
(52) U.S. Cl. ....................... 524/403; 524/785; 524/780; 524/588; 252/514
(58) Field of Search ................................ 524/403, 785, 524/780; 252/514

(56) References Cited

U.S. PATENT DOCUMENTS

| | | | |
|---|---|---|---|
| 2,676,182 A | 4/1954 | Daudt et al. | 260/448.2 |
| 3,419,593 A | 12/1968 | Willing | 260/448.2 |
| 3,609,104 A * | 9/1971 | Ehrreich | 252/511 |
| 4,087,585 A | 5/1978 | Schulz | 428/429 |
| 4,584,355 A | 4/1986 | Blizzard et al. | 525/477 |
| 4,585,836 A | 4/1986 | Homan et al. | 525/477 |
| 4,591,622 A | 5/1986 | Blizzard et al. | 525/477 |
| 4,766,176 A | 8/1988 | Lee et al. | 525/100 |
| 4,836,955 A * | 6/1989 | Ehrreich | 252/512 |
| 5,017,654 A | 5/1991 | Togashi et al. | 525/100 |
| 5,075,038 A * | 12/1991 | Cole et al. | 252/514 |
| 5,194,649 A | 3/1993 | Okawa | 556/451 |
| 5,227,093 A | 7/1993 | Cole et al. | 252/512 |
| 5,384,075 A | 1/1995 | Okami | 252/511 |
| 6,017,587 A * | 1/2000 | Kleyer et al. | 427/387 |
| 6,040,362 A * | 3/2000 | Mine et al. | 523/212 |

FOREIGN PATENT DOCUMENTS

| | | | |
|---|---|---|---|
| EP | 0 653 463 | 5/1995 | C08L/83/07 |
| EP | 0839870 | 5/1998 | |

* cited by examiner

Primary Examiner—Margaret G. Moore
(74) Attorney, Agent, or Firm—Larry A. Milco; Timothy J. Troy; Catherine U. Brown

(57) ABSTRACT

A silicone composition, comprising (A) 10 to 50 parts by weight of a polydiorganosiloxane having the formula $R^1_3SiO(R^1_2SiO)_nSiR^1_3$ wherein each $R^1$ is independently a monovalent aliphatic hydrocarbon group or a monovalent halogenated aliphatic hydrocarbon group, n has a value such that the polydiorganosiloxane has a viscosity from 0.1 to 200 Pa·s at 25° C., and the polydiorganosiloxane contains an average of at least two alkenyl groups per molecule; (B) 50 to 90 parts by weight of an organopolysiloxane resin consisting essentially of $R^2_3SiO_{1/2}$ siloxane units and $SiO_{4/2}$ siloxane units wherein each $R^2$ is independently alkyl or alkenyl, the mole ratio of $R^2_3SiO_{1/2}$ units to $SiO_{4/2}$ units is from 0.65 to 1.9, the resin contains an average of from about 3 to 30 mole percent of alkenyl groups, and the total amount of components (A) and (B) is 100 parts by weight; (C) an organohydrogenpolysiloxane having an average of at least two silicon-bonded hydrogen atoms per molecule in an amount sufficient to cure the composition; (D) an electrically conductive filler in an amount sufficient to impart electrical conductivity to the composition; and (E) a catalytic amount of a hydrosilylation catalyst. An electrically conductive silicone adhesive comprising a reaction product of the above-described composition and a multi-part silicone composition comprising components (A) through (E) in two or more parts, provided neither component (A) nor component (B) are present with components (C) and (E) in the same part.

20 Claims, No Drawings

SILICONE COMPOSITION AND ELECTRICALLY CONDUCTIVE SILICONE ADHESIVE FORMED THEREFROM

FIELD OF THE INVENTION

The present invention relates to a silicone composition and more particularly to an addition-curable silicone composition containing an electrically conductive filler and a specific concentration of an organopolysiloxane resin. The present invention also relates to an electrically conductive silicone adhesive produced from such composition.

BACKGROUND OF THE INVENTION

Silicone adhesives are useful in a variety of applications by virtue of their unique properties, including high thermal stability, good moisture resistance, excellent flexibility, high ionic purity, low alpha particle emissions, and good adhesion to various substrates. For example, silicone adhesives are widely used in the assembly of automotive parts, toys, electronic circuits, and keyboards.

Addition-curable silicone compositions comprising a polydiorganosiloxane, organohydrogenpolysiloxane, electrically conductive filler, and hydrosilylation catalyst are known in the art. For example, U.S. Pat. No. 5,075,038 to Cole et al. discloses an electrically conductive silicone composition, comprising (A) a silicone polymer having greater than 5 percent of the silicon atoms having a phenyl radical attached, or having greater than 5 mole percent vinyl radicals, or having greater than 5 mole percent phenyl and vinyl radicals in combination, said polymer being curable through an addition reaction with a silicon hydride in the presence of a platinum catalyst; and (B) from 12.5 to 50 volume percent of the total composition of silver particles or particles having an outer surface of silver, said composition being free of carbon black and having an electrical resistivity of less than $1 \times 10^{-2}$ ohm-cm, and which electrical resistivity is stable to thermal aging. However, Cole et al. do not teach the specific combination of the organopolysiloxane resin and polymer of the present invention.

U.S. Pat. No. 5,227,093 to Cole et al. discloses, inter alia, an improved curable organosiloxane composition exhibiting electrical conductivity in the cured form, said composition comprising the product obtained by blending to homogeneity an organopolysiloxane containing at least two alkenyl radicals per molecule, an organohydrogensiloxane containing an average of at least two silicon-bonded hydrogen atoms per molecule, an amount of finely divided silver particles sufficient to impart electrical conductivity to said cured material, and a platinum-containing catalyst, the improvement comprising the presence on the surface of said silver particles of a coating of at least one esterified fatty acid. However, Cole et al. do not teach the specific combination of the organopolysiloxane resin and polymer of the present invention.

European Patent Application No. 0 653 463 to Mine et al. discloses (Example 1) an electrically conductive silicone rubber composition prepared by blending to homogeneity 450 parts by weight of a silver powder; 100 parts of a mixture containing 1) a dimethylvinylsiloxy-terminated dimethylpolysiloxane and 2) a silicone resin consisting essentially of $(CH_3)_3SiO_{1/2}$ units, $(CH_2{=}CH)(CH_3)_2SiO_{1/2}$ units, and $SiO_{4/2}$ units; 1 part by weight of a trimethylsiloxy-terminated methylhydrogensiloxane; 10 parts of a hydrophobic fumed silica; 500 ppm, based on the total weight of the composition, of phenylbutynol; a curing catalyst; and 7 parts of an adhesion-promoting organosilicon compound. However, Mine et al. do not teach the specific concentration of the organopolysiloxane resin of the present invention.

U.S. Pat. No. 5,384,075 to Okami discloses an organopolysiloxane composition having a volume resistivity of $10^7$ Ωcm or below, comprising (A) an organopolysiloxane having at least two alkenyl groups in its molecule and a viscosity at 25° C. of from 100 to 200,000 cSt, (B) an organohydrogenpolysiloxane having at least two silicon-bonded hydrogen atoms in its molecule, (C) a platinum group metal catalyst, (D) an organosilicon compound which has at least one silicon-bonded hydrogen atom in its molecule and in which at least one member selected from the group consisting of epoxy group-containing organic groups and alkoxy groups is attached to a silicon atom, and (E) an electrically conductive filler. Okami also discloses an organopolysiloxane resin as an optional ingredient. However, Okami does not teach the specific concentration of the organopolysiloxane resin of the present invention.

Although silicone adhesives produced from the aforementioned compositions exhibit a wide range of electrical properties, there is a continued need for silicone adhesives having improved electrical performance.

SUMMARY OF THE INVENTION

The present inventors have discovered that a silicone composition containing an electrically conductive filler and a specific concentration of an organopolysiloxane resin cures to form an adhesive having unexpectedly superior electrical properties, contact resistance and volume resistivity. Specifically, the present invention is directed to a silicone composition, comprising:

(A) 10 to 50 parts by weight of a polydiorganosiloxane having the formula:

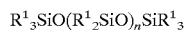

$R^1{}_3SiO(R^1{}_2SiO)_nSiR^1{}_3$ wherein each $R^1$ is independently a monovalent aliphatic hydrocarbon group or a monovalent halogenated aliphatic hydrocarbon group, n has a value such that the polydiorganosiloxane has viscosity from 0.1 to 200 Pa·s at 25° C., and the polydiorganosiloxane contains an average of at least two alkenyl groups per molecule;

(B) 50 to 90 parts by weight of an organopolysiloxane resin consisting essentially of $R^2{}_3SiO_{1/2}$ siloxane units and $SiO_{4/2}$ siloxane units wherein each $R^2$ is independently alkyl or alkenyl, the mole ratio of $R^2{}_3SiO_{1/2}$ units to $SiO_{4/2}$ units is from 0.65 to 1.9, the resin contains an average of from about 3 to 30 mole percent of alkenyl groups, and the total amount of components (A) and (B) is 100 parts by weight;

(C) an organohydrogenpolysiloxane having an average of at least two silicon-bonded hydrogen atoms per molecule in an amount sufficient to cure the composition;

(D) an electrically conductive filler in an amount sufficient to impart electrical conductivity to the composition, wherein the filler comprises particles having at least an outer surface of a metal selected from the group consisting of silver, gold, platinum, palladium, and alloys thereof; and (E) a catalytic amount of a hydrosilylation catalyst.

The present invention is also directed to an electrically conductive silicone adhesive comprising a reaction product of the above-described composition.

The present invention is further directed to a multi-part silicone composition comprising components (A) through (E) in two or more parts, provided neither component (A) nor component (B) are present with components (C) and (E) in the same part.

The silicone composition of the present invention has numerous advantages, including good flow, low VOC (volatile organic compound) content, and adjustable cure. Moreover, the present silicone composition cures to form a silicone adhesive having good adhesion and unexpectedly superior electrical properties.

The silicone composition of the present invention is useful for preparing an electrically conductive silicone adhesive. The silicone adhesive of the present invention has numerous uses, including die attach adhesives, solder replacements, and electrically conductive coatings and gaskets.

These and other features, aspects, and advantages of the present invention will become better understood with reference to the following description and appended claims.

DETAILED DESCRIPTION OF THE INVENTION

A silicone composition according to the present invention comprises:

(A) 10 to 50 parts by weight of a polydiorganosiloxane having the formula:

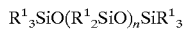

$$R^1_3SiO(R^1_2SiO)_nSiR^1_3$$

wherein each $R^1$ is independently a monovalent aliphatic hydrocarbon group or a monovalent halogenated aliphatic hydrocarbon group, n has a value such that the polydiorganosiloxane has a viscosity from 0.1 to 200 Pa·s at 25° C., and the polydiorganosiloxane contains an average of at least two alkenyl groups per molecule;

(B) 50 to 90 parts by weight of an organopolysiloxane resin consisting essentially of $R^2_3SiO_{1/2}$ siloxane units and $SiO_{4/2}$ siloxane units wherein each $R^2$ is independently alkyl or alkenyl, the mole ratio of $R^2_3SiO_{1/2}$ units to $SiO_{4/2}$ units is from 0.65 to 1.9, the resin contains an average of from about 3 to 30 mole percent of alkenyl groups, and the total amount of components (A) and (B) is 100 parts by weight;

(C) an organohydrogenpolysiloxane having an average of at least two silicon-bonded hydrogen atoms per molecule in an amount sufficient to cure the composition;

(D) an electrically conductive filler in an amount sufficient to impart electrical conductivity to the composition, wherein the filler comprises particles having at least an outer surface of a metal selected from the group consisting of silver, gold, platinum, palladium, and alloys thereof; and (E) a catalytic amount of a hydrosilylation catalyst.

Component (A) of the present invention, also referred to herein as the "polymer," is at least one polydiorganosiloxane having the formula:

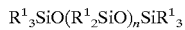

$$R^1_3SiO(R^1_2SiO)_nSiR^1_3$$

wherein each $R^1$ is independently a monovalent aliphatic hydrocarbon group or a monovalent halogenated aliphatic hydrocarbon group, n has a value such that the polydiorganosiloxane has a viscosity from 0.1 to 200 Pa·s at 25° C., and the polydiorganosiloxane contains an average of at least two alkenyl groups per molecule. The structure of the polydiorganosiloxane is typically linear, however it may contain some branching due to the presence of trifunctional siloxane units.

The alkenyl groups represented by $R^1$ typically have from 2 to about 10 carbon atoms and preferably have from 2 to about 6 carbon atoms. Preferably, the alkenyl group is vinyl. The alkenyl groups in the polydiorganosiloxane may be located at terminal, pendant, or both terminal and pendant positions. The monovalent aliphatic hydrocarbon groups and monovalent aliphatic halogenated hydrocarbon groups, excluding alkenyl, represented by $R^1$ typically have from 1 to about 20 carbon atoms and preferably have from 1 to 10 carbon atoms. Acyclic aliphatic hydrocarbon and halogenated hydrocarbon groups having at least three carbon atoms can have a branched or unbranched structure.

Examples of monovalent aliphatic hydrocarbon groups include, but not limited to, alkyl such as methyl, ethyl, propyl, pentyl, octyl, undecyl, and octadecyl; cycloalkyl such as cyclohexyl; and alkenyl such as vinyl, allyl, butenyl, and hexenyl. Examples of monovalent aliphatic halogenated hydrocarbon groups include, but are not limited to, 3,3,3-trifluoropropyl and 3-chloropropyl. Preferably, at least 50 percent, and more preferably at least 80%, of the organic groups represented by $R^1$ are methyl.

The viscosity of the polydiorganosiloxane at 25° C., which varies with molecular weight and structure, is typically from 0.1 to 200 Pa·s and preferably from 1 to 100 Pa·s.

Examples of polydiorganosiloxanes useful in the present invention include, but are not limited to, the following: $ViMe_2SiO(Me_2SiO)_nSiMe_2Vi$, $ViMe_2SiO(Me_2SiO)_{0.98n}(MeViSiO)_{0.02n}SiMe_2Vi$, and $Me_3SiO(Me_2SiO)_{0.95n}(MeViSiO)_{0.05n}SiMe_3$, where Me and Vi denote methyl and vinyl, respectively, and n is as defined above. Preferred polydiorganosiloxanes are dimethylvinylsiloxy-terminated polydimethylsiloxanes. A specific example of a preferred polydiorganosiloxane is a dimethylvinylsiloxy-terminated polydimethylsiloxane having a viscosity of from 45 to 65 Pa·s at 25° C.

Component (A) can be a single polydiorganosiloxane or a mixture comprising two or more polydiorganosiloxanes that differ in at least one of the following properties: structure, viscosity, average molecular weight, siloxane units, and sequence.

The concentration of component (A) in the silicone composition of the present invention is typically from 10 to 50 parts by weight and preferably from 20 to 40 parts by weight, per 100 parts by weight of components (A) and (B) combined.

Methods of preparing the polydiorganosiloxane of the present invention, such as hydrolysis and condensation of organohalosilanes or equilibration of cyclic polydiorganosiloxanes, are well known in the art.

Component (B) of the present invention, also referred to herein as the "resin," is at least one organopolysiloxane resin consisting essentially of $R^2_3SiO_{1/2}$ siloxane units and $SiO_{4/2}$ siloxane units wherein each $R^2$ is independently alkyl or alkenyl. Additionally, the organopolysiloxane resin may contain minor amounts of monoorganosiloxane and diorganosiloxane units. The alkyl groups represented by $R^2$ typically have from 1 to about 6 carbon atoms and preferably have from 1 to about 3 carbon atoms. Examples of alkyl groups include, but are not limited to, methyl, ethyl, propyl, pentyl, hexyl, and cyclohexyl. The alkenyl groups represented by $R^2$ typically have from 2 to about 6 carbon atoms. Examples of alkenyl groups include, but are not limited to, vinyl, allyl, butenyl, and hexenyl. Preferably, the alkyl group is methyl and the alkenyl group is vinyl.

The mole ratio of $R^2_3SiO_{1/2}$ units (M units) to $SiO_{4/2}$ units (Q units) in the organopolysiloxane resin is typically from 0.65 to 1.9, and preferably from 0.9 to 1.8, as determined by $^{29}$Si nuclear magnetic resonance ($^{29}$Si NMR) spectrometry. The M/Q ratio represents the total number of M units to the total number of Q units in the organopolysiloxane resin and includes contributions from any neopentamer present, described below.

Component (B) contains $HOSiO_{3/2}$ units (TOH units), which account for the silicon-bonded hydroxyl content of the organopolysiloxane resin. The silicon-bonded hydroxyl content of component (B), as determined by $^{29}$SiNMR spectrometry, is typically less than 2 percent by weight and preferably less than 1 percent by weight, based on the total weight of the resin.

Component (B) can also contain a small amount of a low molecular weight material comprised substantially of a neopentamer organopolysiloxane having the formula $(R^2SiO)_4Si$, the latter material being a byproduct in the preparation of the resin according to the method of Daudt et al., described infra.

The organopolysiloxane resin typically contains an average of from 3 to 30 mole percent, and preferably from 5 to 15 mole percent, of alkenyl groups. The mole percent of alkenyl groups in the resin is defined here as the ratio of the number of moles of alkenyl-containing siloxane units in the resin to the total number of moles of siloxane units in the resin, multiplied by 100. The total number of moles of siloxane units in the resin includes the M, Q, and TOH units described above. When the resin contains less than 3 mole percent of alkenyl groups, the silicone adhesive tends to be soft and tacky. When the resin contains more than 30 mole percent of alkenyl groups, the silicone adhesive tends to be hard and brittle. Moreover, when the mole percent of alkenyl groups in the resin is outside the stated range, the electrical properties of the adhesive, contact resistance and volume resistivity, markedly deteriorate during thermal cycling.

A preferred organopolysiloxane resin is a resin consisting essentially of $CH_2=CH(CH_3)_2SiO_{1/2}$ units, $(CH_3)_3SiO_{1/2}$ units, and $SiO_{4/2}$ units, wherein the mole ratio of $CH_2=CH(CH_3)_2SiO_{1/2}$ units and $(CH_3)_3SiO_{1/2}$ units combined to $SiO_{4/2}$ units is about 1.8, the resin has a viscosity of about $2.1 \times 10^{-4}$ m$^2$/s at 25° C., and the resin contains about 15 mole percent (5.6% by weight) of vinyl groups.

Component (B) can be a single organopolysiloxane resin or a mixture comprising two or more organopolysiloxane resins that differ in at least one of the following properties: monofunctional (M) siloxane units, M/Q ratio, average molecular weight, hydroxyl content, and alkenyl content.

The concentration of component (B) in the silicone composition of the present invention is important with respect to the properties of the cured silicone adhesive, particularly contact resistance and volume resistivity. The concentration of component (B) is from 50 to 90 parts by weight and preferably from 55 to 80 parts by weight, per 100 parts by weight of components (A) and (B) combined. When the concentration of component (B) is less than 50 parts by weight, the contact resistance and volume resistivity of the silicone adhesive are relatively high. When the concentration of component (B) is greater than 90 parts by weight, the silicone adhesive tends to be hard and brittle and has poor resistance to thermal cycling. In the later case, the adhesive fractures during thermal cycling, causing mechanical and/or electrical failure. Furthermore, it is understood that as the M/Q ratio of the organopolysiloxane resin decreases in the range from 0.65 to 1.9, it may be necessary to reduce the concentration of the resin in the above-stated range to obtain a silicone adhesive having satisfactory resistance to thermal cycling.

The organopolysiloxane resin of the present invention can be prepared by methods well-known in the art. Preferably, the resin is prepared by treating a resin copolymer produced by the silica hydrosol capping process of Daudt et al. with at least an alkenyl-containing endblocking reagent. The method of Daudt et al. is disclosed in U.S. Pat. No. 2,676,182, which is hereby incorporated by reference to teach how to make organopolysiloxane resins suitable for use in the present invention.

Briefly stated, the method of Daudt et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally contain from about 2 to about 5 percent by weight of hydroxyl groups.

The resin of the present invention, which typically contains less than 2 percent by weight of silicon-bonded hydroxyl groups, can be prepared by reacting the product of Daudt et al. with an alkenyl-containing endblocking agent or a mixture of an alkenyl-containing endblocking agent and an endblocking agent free of aliphatic unsaturation in an amount sufficient to provide from 3 to 30 mole percent of alkenyl groups in the final product. Examples of endblocking agents include, but are not limited to, silazanes, siloxanes, and silanes. Suitable endblocking agents are known in the art and exemplified in U.S. Pat. No. 4,584,355 to Blizzard et al.; U.S. Pat No. 4,591,622 to Blizzard et al.; and U.S. Pat. No. 4,585,836 to Homan et al.; which are hereby incorporated by reference. A single endblocking agent or a mixture of such agents can be used to prepare the organopolysiloxane resin of the present invention.

Component (C) of the present invention, also referred to herein as the "crosslinking agent," is at least one organohydrogenpolysiloxane having an average of at least two silicon-bonded hydrogen atoms per molecule and an average of no more than one silicon-bonded hydrogen atom per silicon atom. Of course, it is generally understood that crosslinking occurs when the sum of the average number of alkenyl groups per molecule in components (A) and (B) combined and the average number of silicon-bonded hydrogen atoms in component (C) is greater than four. The silicon-bonded hydrogen atoms in the organohydrogenpolysiloxane can be located at terminal, pendant, or at both terminal and pendant positions.

The organohydrogenpolysiloxane can be a homopolymer or a copolymer. The structure of the organohydrogenpolysiloxane can be linear, branched, or cyclic. Examples of siloxane units that may be present in the organohydrogenpolysiloxane include, but are not limited to, $HR^3{}_2SiO_{1/2}$, $HSiO_{3/2}$, $R^3{}_3SiO_{1/2}$, $HR^3SiO_{2/2}$, $R^3{}_2SiO_{2/2}$, $R^3SiO_{3/2}$, and $SiO_{4/2}$ units. In the preceding formulae each $R^3$ is independently a monovalent aliphatic hydrocarbon or a monovalent halogenated hydrocarbon group free of aliphatic unsaturation, as defined and exemplified above for component (A). Preferably, at least 50 percent of the organic groups in the organohydrogenpolysiloxane are methyl.

A preferred organohydrogenpolysiloxane is an organohydrogenpolysiloxane resin consisting essentially of $H(CH_3)_2SiO_{1/2}$ units, $(CH_3)_3SiO_{1/2}$ units, and $SiO_{4/2}$ units, wherein the resin contains about 1.0 percent by weight of silicon-bonded hydrogen atoms and has a viscosity of about $2.4 \times 10^{-5}$ m$^2$/s.

Component (C) can be a single organohydrogenpolysiloxane or a mixture comprising two or more organohydrogenpolysiloxanes that differ in at least one of the following properties: structure, average molecular weight, viscosity, siloxane units, and sequence.

The concentration of component (C) in the silicone composition of the present invention is sufficient to cure the composition. The exact amount of component (C) depends on the desired extent of cure, which generally increases as the ratio of the number of moles of silicon-bonded hydrogen atoms in component (C) to the number of moles of alkenyl groups present in components (A) and (B) combined increases. Typically, the concentration of component (C) is sufficient to provide from 0.5 to 3 silicon-bonded hydrogen atoms per alkenyl group in components (A) and (B) combined. Preferably, the concentration of component (C) is sufficient to provide from 1 to 2 silicon-bonded hydrogen atoms per alkenyl group in components (A) and (B) combined.

Methods of preparing the organohydrogenpolysiloxane of the present invention, such as hydrolysis and condensation of the appropriate organohalosilanes, are well known in the art.

To ensure compatibility of components (A), (B), and (C), described supra, the predominant organic group in each component is preferably the same. Preferably this group is methyl.

Component (D) of the present invention is at least one electrically conductive filler comprising particles having at least an outer surface of a metal selected from the group consisting of silver, gold, platinum, palladium, and alloys thereof. Fillers comprising particles consisting of silver, gold, platinum, palladium, and alloys thereof typically have the form of a powder or flakes with an average particle size of from 0.5 to 20 µm. Fillers comprising particles having only an outer surface consisting of silver, gold, platinum, palladium, and alloys thereof typically have an average particle size of from 15 to 100 µm. The core of such particles can be any material, electrical conductor or insulator, that supports a surface consisting of the aforementioned metal and does not adversely affect the electrical properties of the silicone adhesive. Examples of such materials include, but are not limited to, copper, solid glass, hollow glass, mica, nickel, and ceramic fiber.

In the case of electrically conductive fillers comprising metal particles having the form of flakes, the surface of the particles may be coated with a lubricant, such as a fatty acid or fatty acid ester. Such lubricants are typically introduced during the milling process used to produce flakes form a metal powder to prevent the powder from cold welding or forming large agglomerates. Even when the flakes are washed with a solvent after milling, some lubricant may remain chemisorbed on the surface of the metal.

The electrically conductive filler of the present invention also includes fillers prepared by treating the surfaces of the aforementioned particles with at least one organosilicon compound. Suitable organosilicon compounds include those typically used to treat silica fillers, such as organochlorosilanes, organosiloxane, organodisilazane, organoalkoxysilanes.

Component (D) can be a single electrically conductive filler as described above or a mixture of two or more such fillers that differ in at least one of the following properties: composition, surface area, surface treatment, particle size, and particle shape.

Preferably, the electrically conductive filler of the present invention comprises particles consisting of silver and more preferably the particles consisting of silver having the form of flakes. A particularly preferred electrically conductive filler is a silver flake sold under the name RA-127 by Chemet Corporation. The filler has a mean particle size of 3.9 µm, a surface area of 0.87 m²/g, an apparent density of 1.55 g/cm³, and a tap density of 2.8 g/cm³.

The concentration of component (D) in the silicone composition of the present invention is sufficient to impart electrical conductivity to the composition. Typically, the concentration of component (D) is such that the composition has a volume resistivity less than about 1 Ω·cm. The exact concentration of component (D) depends on the desired electrical properties, surface area of the filler, density of the filler, shape of the filler particles, surface treatment of the filler, and nature of the other components in the silicone composition. The concentration of component (D) is typically from about 15 to about 100 percent by volume and preferably from about 15 to about 50 percent by volume, based on the total volume of the silicone composition. When the concentration of component (D) is less than about 15 percent by volume, the silicone adhesive does not have significant electrical conductivity. When the concentration of component (D) is greater than about 100 percent by volume, the silicone adhesive does not exhibit substantially improved conductivity.

Methods of preparing electrically conductive fillers suitable for use in the silicone composition of the present invention are well known in the art; many of these fillers are commercially available. For example powders of silver, gold, platinum, or palladium, or alloys thereof are typically produced by chemical precipitation, electrolytic deposition, or cementation. Also, flakes of the aforementioned metals are typically produced by grinding or milling the metal powder in the presence of a lubricant, such as a fatty acid or fatty acid ester. Particles having only an outer surface of at least one of the aforementioned metals are typically produced by metallizing an appropriate core material using a method such as electrolytic deposition, electroless deposition, or vacuum deposition.

As stated above, the electrically conductive filler of the present invention can be a filler prepared by treating the surfaces of the aforementioned particles with at least one organosilicon compound. In this case, the particles can be treated prior to admixture with the other ingredients of the silicone composition or the particles can be treated in situ during the preparation of the silicone composition.

Component (E) of the present invention is a hydrosilylation catalyst that promotes the addition reaction of components (A) and (B) with component (C). The hydrosilylation catalyst can be any of the well known hydrosilylation catalysts comprising a platinum group metal, a compound containing a platinum group metal, or a microencapsulated platinum group metal-containing catalyst. Platinum group metals include platinum, rhodium, ruthenium, palladium, osmium and iridium. Preferably, the platinum group metal is platinum, based on its high activity in hydrosilylation reactions.

Preferred hydrosilylation catalysts include the complexes of chloroplatinic acid and certain vinyl-containing organosiloxanes disclosed by Willing in U.S. Pat. No. 3,419,593, which is hereby incorporated by reference. A preferred catalyst of this type is the reaction product of chloroplatinic acid and 1,3-diethenyl-1,1,3,3-tetramethyldisiloxane.

A particularly preferred hydrosilylation catalyst is a microencapsulated platinum group metal-containing catalyst comprising a platinum group metal encapsulated in a thermoplastic resin. Compositions containing microencapsulated hydrosilylation catalysts are stable for extended periods of time, typically several months or longer, under ambient conditions, yet cure relatively rapidly at temperatures above the melting or softening point of the thermoplastic resin(s).

The thermoplastic resin can be any resin that is insoluble in and impervious to the platinum group metal-containing catalyst, and also is insoluble in the silicone composition.

The thermoplastic resin typically has a softening point of from about 40 to about 250° C.

As used hereinabove, the terms "insoluble" and "impervious" mean that the amount of the thermoplastic resin that dissolves in the catalyst and/or silicone composition and the amount of catalyst that diffuses through the thermoplastic resin encapsulant during storage are insufficient to cause curing of the composition.

Examples of suitable thermoplastic resins include, but are not limited to, vinyl polymers, such as polyethylene, polystyrene, polyvinyl chloride, polyvinylidene chloride, and copolymers of vinyl chloride and vinylidene chloride; polyacrylates, such as polymethacrylate; cellulose derivatives, such as cellulose ethers, esters, and ether-ester; polyamides; polyesters; silicone resins, and polysilanes. Silicone resins are preferred thermoplastic resins according to the present invention.

Preferred catalysts for the preparation of microencapsulated hydrosilylation catalysts are platinum catalysts, such as chloroplatinic acid, alcohol-modified chloroplatinic acid, platinum/olefin complexes, platinum/ketone complexes, and platinum/vinylsiloxane complexes.

The average particle size of the microencapsulated catalyst is typically from about 1 to about 500 $\mu$m and preferably is from about 1 to about 100 $\mu$m. The microencapsulated catalyst typically contains at least 0.01 percent by weight of the platinum group metal-containing catalyst.

A preferred microencapsulated hydrosilylation catalyst contains a platinum complex of 1,3-diethenyl-1,1,3,3-tetramethyldisiloxane encapsulated in a silicone resin consisting of 78 mole percent monophenylsiloxane units and 22 mole percent dimethylsiloxane units, wherein the silicone resin has a glass transition temperature of 60° C.; and a softening temperature of 90° C. The microencapsulated catalyst has an average particle size of 1.8 $\mu$m and a platinum content of 0.4 percent by weight.

Methods of preparing microencapsulated hydrosilylation catalysts are well known in the art. Examples of such methods include, but are not limited to, chemical methods such as interfacial polymerization and in situ polymerization; physico-chemical methods, such as coacervation and emulsionisuspension hardening; and physical-mechanical methods, such as spray drying.

Microencapsulated hydrosilylation catalysts and methods of preparing them are further described in U.S. Pat. No. 4,766,176 and the references cited therein; and U.S. Pat. No. 5,017,654. The relevant portions of these patents are hereby incorporated by reference to teach microencapsulated catalysts and methods of preparing microencapsulated catalysts suitable for use in the present invention.

The concentration of component (E) is sufficient to catalyze the addition reaction of components (A) and (B) with component (C). Typically, the concentration of component (E) is sufficient to provide from 0.1 to 1000 ppm of a platinum group metal, preferably from 1 to 500 ppm of a platinum group metal, and more preferably from 5 to 150 ppm of a platinum group metal, based on the combined weight of components (A), (B), and (C). The rate of cure is very slow below 0.1 ppm of platinum group metal. The use of more than 1000 ppm of platinum group metal results in no appreciable increase in cure rate, and is therefore uneconomical.

Mixtures of the aforementioned components (A), (B), (C), (D), and (E) may begin to cure at ambient temperature. To obtain a longer working time or "pot life", the activity of the catalyst under ambient conditions can be retarded or suppressed by the addition of a suitable inhibitor to the silicone composition of the present invention. A platinum catalyst inhibitor retards curing of the present silicone composition at ambient temperature, but does not prevent the composition from curing at elevated temperatures. Suitable platinum catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-phenyl-3-butyn-2-ol; maleates and fumarates, such as the well known dialkyl, dialkenyl, and dialkoxyalkyl fumarates and maleates; and cyclovinylsiloxanes.

Acetylenic alcohols constitute a preferred class of inhibitors in the silicone composition of the present invention. In particular, 2-phenyl-3-butyn-2-ol is a preferred inhibitor according to the present invention. Compositions containing these inhibitors generally require heating at 70° C. or above to cure at a practical rate.

The concentration of platinum catalyst inhibitor in the present silicone composition is sufficient to retard curing of the composition at ambient temperature without preventing or excessively prolonging cure at elevated temperatures. This concentration will vary widely depending on the particular inhibitor used, the nature and concentration of the hydrosilylation catalyst, and the nature of the organohydrogenpolysiloxane.

Inhibitor concentrations as low as one mole of inhibitor per mole of platinum group metal will in some instances yield a satisfactory storage stability and cure rate. In other instances, inhibitor concentrations of up to 500 or more moles of inhibitor per mole of platinum group metal may be required. The optimum concentration for a particular inhibitor in a given silicone composition can be readily determined by routine experimentation.

Preferably, the silicone composition of the present invention further comprises an adhesion promoter that effects strong unprimed adhesion of the silicone composition to substrates commonly employed in the construction of electronic devices; for example, silicon; passivation coatings, such as silicon dioxide and silicon nitride; glass; metals, such as copper and gold; ceramics; and organic resins, such as polyimide. The adhesion promoter can be any adhesion promoter typically employed in silicone compositions, provided it does not adversely affect the physical properties of the silicone adhesive, particularly contact resistance and volume resistivity. The adhesion promoter can be a single adhesion promoter or a mixture of two or more different adhesion promoters.

The concentration of the adhesion promoter in the composition of the present invention is sufficient to effect adhesion of the composition to a substrate, such as those cited above. The concentration can vary over a wide range depending on the nature of the adhesion promoter, the type of substrate, and the desired adhesive bond strength. The concentration of the adhesion promoter is generally from 0.01 to about 10 percent by weight, based on the total weight composition. However, the optimum concentration of the adhesion promoter can be readily determined by routine experimentation.

A preferred adhesion promoter according to the present invention is an adhesion promoter prepared by mixing at least one polysiloxane having at least one silicon-bonded alkenyl group and at least one silicon-bonded hydroxyl group per molecule and at least one epoxy-containing alkoxysilane. The polysiloxane typically has less than about 15 silicon atoms per molecule and preferably has 3 to about 15 silicon atoms per molecule. The alkenyl groups in the polysiloxane typically have 2 to about 6 carbon atoms.

Examples of alkenyl groups include, but are not limited to, vinyl, allyl, and hexenyl. Preferably, the alkenyl group is vinyl. The remaining silicon-bonded organic groups in the polysiloxane are independently selected from the group consisting of alkyl and phenyl. The alkyl groups typically have less than about 7 carbon atoms. Suitable alkyl groups are exemplified by, but not limited to, methyl, ethyl, propyl, and butyl. Preferably, the alkyl group is methyl.

The silicon-bonded hydroxyl and silicon-bonded alkenyl groups in the polysiloxane can be located at terminal, pendant, or at both terminal and pendant positions. The polysiloxane can be a homopolymer or a copolymer. The structure of the polysiloxane is typically linear or branched. The siloxane units in the polysiloxane may include $CH_2=CHSiO_{3/2}$, $C_6H_5SiO_{3/2}$, $R^4(CH_2=CH)SiO_{2/2}$, $R^4(C_6H_5)SiO_{2/2}$, $(C_6H_5)_2SiO_{2/2}$, $(C_6H_5)(CH_2=CH)SiO_{2/2}$, $(HO)R^4{}_2SiO_{1/2}$, $(CH_2=CH)R^4{}_2SiO_{1/2}$, and $(HO)(C_6H_5)R^4SiO_{1/2}$, where $R^4$ is an alkyl group having less than about 7 carbon atoms as exemplified above. Preferably, the polysiloxane is a hydroxyl-terminated polydiorganosiloxane containing methylvinylsiloxane units. Such polysiloxanes and methods for their preparation are well known in the art.

The epoxy-containing alkoxysilane contains at least one epoxy-containing organic group and at least one silicon-bonded alkoxy group. The structure of the epoxy-containing alkoxysilane is typically linear or branched. The alkoxy groups in the epoxy-containing alkoxysilane typically have less than about 5 carbon atoms and are exemplified by methoxy, ethoxy, propoxy, and butoxy, wherein methoxy is a preferred alkoxy group. Preferably, the epoxy-containing organic group has the formula:

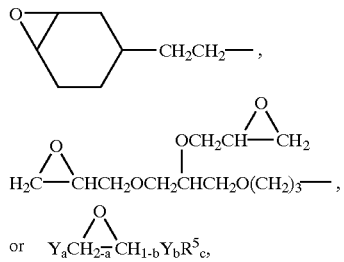

wherein each Y is independently an alkyl group having 1 or 2 carbon atoms; a is 0, 1, or 2; b and c are each 0 or 1; and $R^5$ is a divalent hydrocarbon group having no more than 12 carbon atoms. Preferably, $R^5$ is selected from the group consisting of a saturated aliphatic hydrocarbon group, an arylene group, and a divalent group having the formula

wherein $R^6$ is a divalent saturated aliphatic hydrocarbon group having 1 to 6 carbon atoms and d has a value of from 0 to 8.

The remaining silicon-bonded organic groups in the epoxy-containing alkoxysilane are independently selected from the group consisting of monovalent hydrocarbon groups having less than 7 carbon atoms and fluorinated alkyl groups having less than about 7 carbon atoms. The monovalent hydrocarbon groups are exemplified by, but not limited to, alkyl, such as methyl, ethyl, propyl, and hexyl; alkenyl, such as vinyl and allyl; and aryl such as phenyl. Examples of suitable fluorinated alkyl groups include, but are not limited to, 3,3,3-trifluoropropyl, β-(perfluoroethyl)ethyl, and β-(perfluoropropyl)ethyl. Preferably, the epoxy-containing alkoxysilane is a monoepoxytrialkoxysilane. A specific example of a preferred epoxy-containing alkoxysilane is glycidoxypropyltrimethoxysilane. Methods for the preparation of such silanes are well known in the art.

The two components of the aforementioned adhesion promoter can be either mixed directly together and added to the composition of the present invention or added separately to the composition. Typically the relative amount of the polysiloxane and silane are adjusted to provide about one mole of the silane per mole of silanol groups in the polysiloxane.

The preceding class of adhesion promoters are disclosed in U.S. Pat. No. 4,087,585, which is hereby incorporated by reference to teach adhesion promoters suitable for use in the silicone composition of the present invention.

Preferably, the polysiloxane and epoxy-containing alkoxysilane are first mixed and then added to the composition. More preferably, the polysiloxane and silane are reacted at an elevated temperature. The organopolysiloxane and the silane can be reacted using well known methods of reacting silanol-containing organosiloxanes with alkoxysilanes. The reaction is typically carried out in the presence of a basic catalyst. Examples of suitable catalysts include, but are not limited to, alkali metal hydroxides, alkali metal alkoxides, and alkali metal silanoates. Preferably, the reaction is carried out using about one mole of the silane per silicon-bonded hydroxyl group in the organopolysiloxane. The organopolysiloxane and silane can be reacted either in the absence of a diluent or in the presence of an inert organic solvent, such as toluene. The reaction is preferably carried out at an elevated temperature, for example, from about 80 to about 150° C.

A particularly preferred adhesion promoter according to the present invention is an organopentasiloxane having the formula:

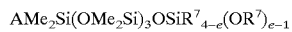

wherein A is hydrogen or an aliphatically unsaturated monovalent hydrocarbon group, $R^7$ is alkyl, and e is an integer from 2 to 4.

Examples of aliphatically unsaturated monovalent hydrocarbon groups represented by A include, but are not limited to, vinyl, allyl, butenyl, hexenyl, and isopropenyl. Preferably A is a hydrogen atom or a vinyl group, based on availability of starting materials an cost. The alkyl groups represented by $R^7$ typically have 1 to about 6 carbon atoms and preferably have 1 to 3 carbon atoms. Examples of suitable alkyl groups include, but are not limited to methyl, ethyl, propyl, butyl, pentyl, and hexyl. Alkyl groups containing at least 3 carbon atoms can have a branched or unbranched structure. Preferably, $R^7$ is methyl or ethyl, based on availability of starting materials and cost.

The organopentasiloxane can be prepared by first reacting hexamethylcyclotrisiloxane with an organosilane having the formula $AMe_2SiX$ to produce a tetrasiloxane having the formula $AMe_2Si(OMe_2Si)_3X$ where A is defined above and X is a halogen. The tetrasiloxane is then hydrolyzed to produce an alpha-hydroxytetrasiloxane having the formula $AMe_2Si(OMe_2Si)_3OH$ wherein A is defined above. The alpha-hydroxytetrasiloxane is reacted with an organosiloxane having the formula $R^7{}_{4-e}Si(OR^7)_e$ wherein $R^7$ and e are defined above.

A specific example of an organopentasiloxane according to the present invention is 1-vinyl-9,9,9-trimethoxyoctamethylpentasiloxane, having the formula $ViMe_2SiO(Me_2SiO)_3Si(OMe)_3$ where Vi is vinyl and Me is methyl. This organopentasiloxane is particularly preferred in silicone compositions of the present invention comprising a microencapsulated hydrosilylation catalyst. Importantly, the organopentasiloxane does not cause dissolution of the silicone resin in the microencapsulated catalyst under ambient conditions. Also, the aforementioned organopentasiloxane exhibits superior adhesion to metals commonly used in the fabrication of electronic devices.

The preceding class of adhesion promoters is disclosed in U.S. Pat. No. 5,194,649, which is hereby incorporated by reference to teach adhesion promoters suitable for use in the silicone composition of the present invention.

The silicone composition of the present invention can further comprise an appropriate quantity of a solvent to lower the viscosity of the composition and facilitate the preparation, handling, and application of the composition. Examples of suitable solvents include, but are not limited to, saturated hydrocarbons having from 1 to about 20 carbon atoms; aromatic hydrocarbons such as xylenes; mineral spirits; halohydrocarbons; esters; ketones; silicone fluids such as linear, branched, and cyclic polydimethylsiloxanes; and mixtures of such solvents. The optimum concentration of a particular solvent in the present silicone composition can be readily determined by routine experimentation.

In general, the silicone composition of the present invention can also comprise small amounts of additional ingredients such as antioxidants, pigments, stabilizers, pre-cured silicone rubber powders, and fillers, provided the ingredient does not adversely affect the physical properties of the silicone adhesive, particularly the contact resistance and volume resistivity.

The silicone composition of the present invention can be a one-part composition comprising components (A) through (E) in a single part or, alternatively, a multi-part composition comprising components (A) through (E) in two or more parts, provided neither component (A) nor component (B) are present with components (C) and (E) in the same part. For example, a multi-part silicone composition for preparing a silicone adhesive can comprise a first part containing a portion of component (A), a portion of component (B), a portion of component (D), and all of component (E) and a second part containing the remaining portions of components (A), (B), and (D) and all of component (C).

The one-part silicone composition of the instant invention is typically prepared by combining components (A) through (E) and any optional ingredients in the stated proportions at ambient temperature with or without the aid of a solvent, which is described above. Although the order of addition of the various components is not critical if the silicone composition is to be used immediately, the hydrosilylation catalyst is preferably added last at a temperature below about 30° C. to prevent premature curing of the composition. Also, the multi-part silicone composition of the present invention can be prepared by combining the particular components designated for each part.

Mixing can be accomplished by any of the techniques known in the art such as milling, blending, and stirring, either in a batch or continuous process. The particular device is determined by the viscosity of the components and the viscosity of the final silicone composition.

The silicone composition of the present invention should be stored in a sealed container to prevent exposure to air and moisture. The one part silicone composition of the present invention may be stored at room temperature for several weeks without any change in the properties of the cured silicone adhesive product. However, the shelf life of the one part silicone composition of this invention can be extended to several months by storing the mixtures at a temperature below 0° C., preferably from −30 to −20° C. Individual sealed packages of the multi-part silicone composition described above can be stored for over 6 months at ambient conditions without any deterioration in the performance of the composition produced upon their admixture.

The silicone composition of the present invention can be applied to a wide variety of solid substrates including, but are not limited to, metals such as aluminum, gold, silver, copper, and iron, and their alloys; silicon; fluorocarbon polymers such as polytetrafluoroethylene and polyvinylfluoride; polyamides such as Nylon; polyimides; polyesters; ceramics; and glass. Furthermore, the silicone composition of the instant invention can be applied to a substrate by any suitable means such as spraying, syringe dispensing, screen or stencil printing, or ink jet printing.

A silicone adhesive according to the present invention comprises a reaction product of the silicone composition containing components (A) through (E), described above. The silicone composition of this invention can be cured at room temperature or by heating at temperatures up to 200° C., preferably from 70 to 200° C., and more preferably from 125 to 175° C., for a suitable length of time. For example, the present silicone composition cures in less than about 2 hours at 150° C.

The silicone composition of the present invention has numerous advantages, including good flow, low VOC (volatile organic compound) content, and adjustable cure. Moreover, the present silicone composition cures to form a silicone adhesive having good adhesion and unexpectedly superior electrical properties.

With regard to flow, the present silicone composition possesses the rheological properties required for a number of applications and is easily dispensed and applied using standard equipment.

Furthermore, the silicone composition of the present invention, which does not require a solvent for many applications, has a very low VOC content. Consequently, the present silicone composition avoids the health, safety, and environmental hazards associated with solvent-borne silicone compositions. In addition, the solventless composition of the present invention typically undergoes less shrinkage during curing than solvent-borne silicone compositions.

The silicone composition of the present invention cures rapidly at moderately elevated temperatures without the formation of detectable by products. The cure rate of the silicone composition can be conveniently adjusted by regulating the concentration of catalyst and/or optional inhibitor.

Further, the silicone composition of the present invention cures to form a silicone adhesive having good adhesion to a wide variety of materials, including metals, glass, silicon, silicon dioxide, ceramics, polyesters, and polyimides.

Importantly, the silicone composition of the present invention cures to form a silicone adhesive having unexpectedly superior electrical properties, initial contact resistance and volume resistivity, compared with similar silicone compositions containing a lower concentration of organopolysiloxane resin. Moreover, the silicone adhesive generally exhibits excellent retention of these electrical properties upon thermal cycling.

The silicone composition of the present invention is useful for preparing an electrically conductive silicone adhesive. The silicone adhesive of the present invention has numerous uses, including die attach adhesives, solder replacements, and electrically conductive coatings and gaskets.

EXAMPLES

The following examples are presented to further illustrate the silicone composition of this invention, but are not to be considered as limiting the invention, which is delineated in the appended claims. Unless otherwise noted, all parts and percentages reported in the examples are by weight. The following methods and materials were employed in the examples:

The Contact resistance of a silicone adhesive was determined using a Keithley Instruments Model 580 Micro-ohm Meter equipped with a 4-pole probe having spring-loaded, gold-plated, chisel point tips. A contact resistance joint was prepared by first plating two square copper bars (0.254 cm×0.254 cm×2.032 cm) with a nickel flash and then with Type II, grade C, hard gold to a minimum thickness of 0.00013 cm. A small aliquot of the silicone composition was applied at approximately the center (lengthwise) of one bar. A second bar was then oriented perpendicular to the first bar with the center (lengthwise) of each bar facing the other and the silicone composition forming an interface between the two bars. Finally, the cross-shaped (+) fixture was cured in a forced air oven at 150° C. for two hours. After allowing the sample to cool to room temperature, the initial contact resistance of the joint was measured. Additional contact resistance measurements were determined after subjecting the assembly to 1 week and 6 weeks of continuous temperature cycling, as described below. The reported values for contact resistance, expressed in units of milliohms, represent the average of three measurements, each performed on identically prepared test specimens.

The volume resistivity of a silicone adhesive was determined using a Keithley Instruments Model 580 Micro-ohm Meter equipped with a four-point probe having spring-loaded, gold-plated, spherical tips. A test specimen was prepared by first placing two strips of 3M Scotch Tape 0.25 cm apart on a glass microscope slide to form a channel extending the length of the slide. An aliquot of the silicone composition was deposited at one end of the slide and over the channel. The composition was then spread over the entire channel by drawing a razor blade through the composition and across the surface at an angle of 45°. The tape strips were removed and the specimen was cured in a forced air oven at 150° C. for two hours. After allowing the sample to cool to room temperature, the voltage drop between the two inner probe tips was measured at an appropriate current to give a resistance value in milliohms. The initial volume resistivity of the adhesive was then calculated using the following equation:

$$V = R(W \times T/L)$$

where V is volume resistivity in milliohm-centimeters, R is resistance (milliohms) of the adhesive measured between two inner probe tips spaced 2.54 cm apart, W is the width of the adhesive layer in centimeters, T is the thickness of the adhesive layer in centimeters, and L is the length of the adhesive layer between the inner probes in centimeters (2.54 cm). The thickness of the adhesive layer, typically about 0.005 cm, was determined using an Ames Model P3-500 thickness gauge. The volume resistivity of the silicone adhesive was also determined after one week and six weeks of continuous temperature cycling, as described below. The reported values for volume resistivity, expressed in units of milliohm-centimeters, represent the average of three measurements, each performed on an identically prepared test specimen.

The silicone adhesive samples were subjected to continuous temperature cycling using a Thermotron HPS-16 temperature test chamber. During each cycle, the test specimen was maintained at −50° C. for 10 minutes, heated from −50° C. to 150° C. in 30 minutes, maintained at 150° C. for 10 minutes, and cooled from 150° C. to −50° C. in 30 minutes.

Polymer A: a dimethylvinylsiloxy-terminated polydimethylsiloxane having a viscosity of about 45 to 65 Pa·s at 25° C.

Resin A: an organopolysiloxane resin consisting essentially of $CH_2=CH(CH_3)_2SiO_{1/2}$ units, $(CH_3)_3SiO_{1/2}$ units, and $SiO_{4/2}$ units, wherein the mole ratio of $CH_2=CH(CH_3)_2SiO_{1/2}$ units and $(CH_3)_3SiO_{1/2}$ units combined to $SiO_{4/2}$ units is about 1.8, the resin has a viscosity of about $2.1 \times 10^{-4}$ m²/s at 25° C., and the resin contains about 15 mole percent (5.6% by weight) of vinyl groups.

Resin B: A solution consisting of 73.1 percent by weight of an organopolysiloxane resin in xylenes wherein the resin consists essentially of $(CH_2=CH(CH_3)_2SiO_{1/2}$ units, $(CH_3)_3SiO_{1/2}$ units, and $SiO_{4/2}$ units, the mole ratio of $CH_2=CH(CH_3)_2SiO_{1/2}$ units and $(CH_3)_3SiO_{1/2}$ units combined to $SiO_{4/2}$ units is about 0.9, and the resin has a weight-average molecular weight of about 5,000, a polydispersity of about 2, and contains about 7 mole percent (2.7 percent by weight) of vinyl groups.

Resin C: A solution consisting of 70.0 weight percent of an organopolysiloxane resin in xylenes wherein the resin consists essentially of $CH_2=CH(CH_3)_2SiO_{1/2}$ units, $(CH_3)_3SiO_{1/2}$ units, and $SiO_{4/2}$ units, the mole ratio of $CH_2=CH(CH_3)_2SiO_{1/2}$ units and $(CH_3)_3SiO_{1/2}$ units combined to $SiO_{4/2}$ units is about 0.7, and the resin has a weight-average molecular weight of about 22,000, a polydispersity of about 5, and contains about 5.5 mole percent (1.8 percent by weight) of vinyl groups.

Crosslinking Agent: an organohydrogenpolysiloxane consisting essentially of $H(CH_3)_2SiO_{1/2}$ units, $(CH_3)_3SiO_{1/2}$ units, and $SiO_{4/2}$ units, wherein the organohydrogenpolysiloxane contains about 1.0 percent by weight of silicon-bonded hydrogen atoms and has a viscosity of about $2.4 \times 10^{-5}$ m²/s.

Adhesion Promoter: an organopentasiloxane having the formula $ViMe_2SiO(Me_2SiO)_3Si(OMe)_3$.

Adhesion Promoter/Inhibitor blend: a mixture consisting of 97 percent by weight of $ViMe_2SiO(Me_2SiO)_3Si(OMe)_3$ and 3 percent by weight of 2-phenyl-3-butyn-2-ol.

Filler: a silver flake sold under the name RA-127 by Chemet Corporation. The filler has a mean particle size of 3.9 μm, a surface area of 0.87 m²/g, an apparent density of 1.55 g/cm³, and a tap density of 2.8 g/cm³.

Catalyst A: is mixture consisting of 40 percent by weight of a complex of platinum with 1,3-divinyl-1,1,3,3-tetramethyldisiloxane dispersed in a thermoplastic silicone resin, wherein the resin consists of 78 mole percent monophenylsiloxane units and 22 mole percent dimethylsiloxane units and the resin has a softening point of 80–90° C.; 55 percent by weight of Polymer B, a dimethylvinylsiloxy-terminated polydimethylsiloxane having a viscosity of 2 Pa·s at 25° C. and a vinyl content of 0.2 percent by weight; and 5 percent by weight of a hexamethyldisilazane-treated fumed silica. The catalyst has a platinum content of about 0.16 percent by weight.

Catalyst B: a dispersion of a platinum complex of 1,3-divinyl-1,1,3,3-tetramethyldisiloxane in Resin A, wherein the catalyst contains 0.54 percent by weight of platinum.

Example 1

A silicone composition was prepared by combining 8.10 parts of Catalyst A, 38.22 parts of Polymer, 5.11 parts of Adhesion Promoter/Inhibitor Blend, 7.29 parts of Adhesion Promoter, 57.33 parts of Resin A, and 583.52 parts (28% by volume) of Filler in a 1 oz. plastic cup. The components were blended for about 26 seconds using an AM-501 Hauschild dental mixer. The mixture was then cooled to room temperature by immersing the cup in a water bath for approximately 5 minutes. Crosslinking Agent (29.83 parts) was added to the mixture and the aforementioned mixing and cooling procedure was repeated twice. The contact resistance and volume resistivity of the cured silicone adhesive are shown in Table 1.

Example 2

A silicone composition was prepared using the method of Example 1 and the following concentrations of components: 8.60 parts of Catalyst A, 19.05 parts of Polymer, 5.42 parts of Adhesion Promoter/Inhibitor Blend, 7.75 parts of Adhesion Promoter, 76.22 parts of Resin A, 619.67 parts (28% by volume) of Filler, and 37.88 parts of Crosslinking Agent. The contact resistance and volume resistivity of the cured silicone adhesive are shown in Table 1.

Comparative Example 1

A silicone composition was prepared using the method of Example 1, except Resin A was omitted and the following concentrations of components were employed: 6.57 parts of Catalyst A, 96.39 parts of Polymer, 4.14 parts of Adhesion Promoter/Inhibitor Blend, 5.92 parts of Adhesion Promoter, 473.37 parts (28% by volume) of Filler, and 5.33 parts of Crosslinking Agent. The contact resistance and volume resistivity of the cured silicone adhesive are shown in Table 1.

Comparative Example 2

A silicone composition was prepared using the method of Example 1 and the following concentrations of components: 7.59 parts of Catalyst A, 57.51 parts of Polymer, 4.78 parts of Adhesion Promoter/Inhibitor Blend, 6.83 parts of Adhesion Promoter, 38.32 parts of Resin A, 546.45 parts (28% by volume) of Filler, and 21.58 parts of Crosslinking Agent. The contact resistance and volume resistivity of the cured silicone adhesive are shown in Table 1.

Comparative Example 3

A silicone composition was prepared using the method of Example 1, except Polymer A was omitted and the following concentrations of components were employed: 9.09 parts of Catalyst A, 5.73 parts of Adhesion Promoter/Inhibitor Blend, 8.19 parts of Adhesion Promoter, 95.00 parts of Resin A, 655.20 parts (28% by volume) of Filler, and 45.78 parts of Crosslinking Agent. The contact resistance and volume resistivity of the cured silicone adhesive are shown in Table 1.

TABLE 1

| Example | Parts By Weight Resin[1] | Contact Resistance[2] (mΩ) | | | Volume Resistivity[3] (mΩ · cm) | | |
|---|---|---|---|---|---|---|---|
| | | Initial | 1 Wk | 6 Wk | Initial | 1 Wk | 6 Wk |
| Example 1 | 57 | 11.87 | 76.38 | 6438.33 | 0.31 | 0.51 | 1.61 |
| Example 2 | 76 | 6.45 | 11.28 | 95.34 | 0.20 | 0.24 | 0.53 |
| Comp. Ex. 1 | 0 | — | — | — | — | — | — |
| Comp. Ex. 2 | 38 | 164.67 | 44067 | — | 0.98 | 2.62 | 30.68 |

TABLE 1-continued

| Example | Parts By Weight Resin[1] | Contact Resistance[2] (mΩ) | | | Volume Resistivity[3] (mΩ · cm) | | |
|---|---|---|---|---|---|---|---|
| | | Initial | 1 Wk | 6 Wk | Initial | 1 Wk | 6 Wk |
| Comp. Ex. 3 | 95 | 7.57 | 82.80 | B | 0.30 | 0.52 | 1.25 |

[1]Parts by weight of resin per 100 parts by weight of resin and polymer combined.
[2]B denotes a broken joint and — denotes a value exceeding 2 × 10$^8$ mΩ.
[3]— denotes a value exceeding 1 × 10$^5$ mΩ·cm.

Example 3

A silicone composition was prepared by combining 2.13 parts of Catalyst B, 39.17 parts of Polymer, 80.35 parts of Resin B, 12.13 parts of xylenes, 518.81 parts of Filler (23.2% by volume), and 11.28 parts of Adhesion Promoter/Inhibitor Blend in a 1 oz. plastic cup. The components were blended for about 26 seconds using an AM-501 Hauschild dental mixer. The mixture was then cooled to room temperature by immersing the cup in a water bath for approximately 5 minutes. Crosslinking Agent (18.35 parts) was added to the mixture and the aforementioned mixing and cooling procedure was repeated. The contact resistance and volume resistivity of the cured silicone adhesive are shown in Table 2.

Example 4

A silicone composition was prepared using the method of Example 3 and the following concentrations of components: 2.20 parts of Catalyst B, 19.58 parts of Polymer, 107.04 parts of Resin B, 6.04 parts of xylenes, 536.55 parts of Filler (23.2% by volume), 11.67 parts of Adhesion Promoter/Inhibitor Blend, and 22.40 parts of Crosslinking Agent. The contact resistance and volume resistivity of the cured silicone adhesive are shown in Table 2.

Comparative Example 4

A silicone composition outside the scope of the present invention was prepared using the method of Example 3, except resin B was omitted and the following concentrations of components were employed: 1.91 parts of Catalyst B, 98.13 parts of Polymer, 30.32 parts of xylenes, 466.47 parts of Filler (23.2% by volume), 10.14 parts of Adhesion Promoter/Inhibitor Blend, and 6.41 parts of Crosslinking Agent. The contact resistance and volume resistivity of the cured silicone adhesive are shown in Table 2.

Comparative Example 5

A silicone composition was prepared using the method of Example 3 and the following concentrations of components: 2.06 parts of Catalyst B, 58.84 parts of Polymer, 53.58 parts of Resin B, 18.19 parts of xylenes, 501.88 parts of Filler (23.2% by volume), 10.91 parts of Adhesion Promoter/Inhibitor Blend, and 14.43 parts of Crosslinking Agent. The contact resistance and volume resistivity of the cured silicone adhesive are shown in Table 2.

Comparative Example 6

A silicone composition was prepared using the method of Example 3, except Polymer A and additional xylenes were omitted and the following concentrations of components were employed: 2.27 parts of Catalyst B, 133.79 parts of Resin B, 554.02 parts of Filler (23.2% by volume), 12.05 parts of Adhesion Promoter/Inhibitor Blend, and 26.39 parts of Crosslinking Agent. The contact resistance and volume resistivity of the cured silicone adhesive are shown in Table 2.

TABLE 2

| Example | Parts By Weight Resin[1] | Contact Resistance[2] (mΩ) | | | Volume Resistivity[3] (mΩ · cm) | | |
|---|---|---|---|---|---|---|---|
| | | Initial | 1 Wk | 6 Wk | Initial | 1 Wk | 6 Wk |
| Example 3 | 61 | 0.66 | 0.50 | 0.96 | 0.73 | 0.91 | 2.42 |
| Example 4 | 80 | 0.67 | 0.76 | 2.97 | 1.00 | 1.93 | 6.53 |
| Comp. Ex. 4 | 2 | — | — | — | — | — | — |
| Comp. Ex. 5 | 41 | 1.99 | 2.11 | 14.21 | 120.80 | — | — |
| Comp. Ex. 6 | 100 | 2.03 | B | B | — | C | C |

[1]Parts by weight of resin per 100 parts by weight of resin and polymer combined.
[2]B denotes a broken joint and — denotes a value exceeding 2 × 10$^8$ mΩ.
[3]C denotes a cracked adhesive layer and — denotes a value exceeding 1 × 10$^5$ mΩ·cm.

Example 5

A silicone composition was prepared by combining 2.05 parts of Catalyst B, 39.20 parts of Polymer, 84.03 parts of Resin C, 14.90 parts of xylenes, 500.94 parts of Filler (22.4% by volume), and 10.89 parts of Adhesion Promoter/Inhibitor Blend in a 1 oz. plastic cup. The components were blended for about 26 seconds using an AM-501 Hauschild dental mixer. The mixture was then cooled to room temperature by immersing the cup in a water bath for approximately 5 minutes. Crosslinking Agent (14.28 parts) was added to the mixture and the aforementioned mixing and cooling procedure was repeated. The contact resistance and volume resistivity of the cured silicone adhesive are shown in Table 3.

Example 6

A silicone composition was prepared using the method of Example 5 and the following concentrations of components: 2.10 parts of Catalyst B, 19.58 parts of Polymer, 111.96 parts of Resin C, 7.29 parts of xylenes, 511.84 parts of Filler (22.4% by volume), 11.13 parts of Adhesion Promoter/Inhibitor Blend, and 16.76 parts of Crosslinking Agent. The contact resistance and volume resistivity of the cured silicone adhesive are shown in Table 3.

Comparative Example 7

A silicone composition was prepared using the method of Example 5, except Resin C was omitted and the following concentrations of components were employed: 1.91 parts of Catalyst B, 98.13 parts of Polymer, 30.32 parts of xylenes, 466.47 parts of Filler (23.2% by volume), 10.14 parts of Adhesion Promoter/Inhibitor Blend, and 6.41 parts of Crosslinking Agent. The contact resistance and volume resistivity of the cured silicone adhesive are shown in Table 3.

Comparative Example 8

A silicone composition was prepared using the method of Example 5 and the following concentrations of components: 2.00 parts of Catalyst B, 58.84 parts of Polymer, 56.02 parts of Resin C, 22.39 parts of xylenes, 489.30 parts of Filler (22.4% by volume), 10.65 parts of Adhesion Promoter/Inhibitor Blend, and 11.62 parts of Crosslinking Agent. The contact resistance and volume resistivity of the cured silicone adhesive are shown in Table 3.

Comparative Example 9

A silicone composition was prepared using the method of Example 5, except Polymer A and additional xylenes were omitted and the following concentrations of components were employed: 2.15 parts of Catalyst B, 139.88 parts of Resin C, 523.90 parts of Silver Filler (22.4% by volume), 11.40 parts of Adhesion Promoter/Inhibitor Blend, and 19.52 parts of Crosslinking Agent. The contact resistance and volume resistivity of the cured silicone adhesive are shown in Table 3.

TABLE 3

| Example | Resin/ Polymer (w/w) | Contact Resistance (mΩ) | | | Volume Resistivity (mΩ · cm) | | |
|---|---|---|---|---|---|---|---|
| | | Initial | 1 Wk | 6 Wk | Initial | 1 Wk | 6 Wk |
| Example 5 | 61 | 0.66 | 3.15 | 7.14 | 23.97 | — | — |
| Example 6 | 80 | 0.64 | B | B | 23.86 | — | — |
| Comp. Ex. 7 | 2 | — | — | — | — | — | — |
| Comp. Ex. 8 | 41 | 1.89 | 11.42 | 218.14 | — | — | — |
| Comp. Ex. 9 | 100 | 0.72 | B | B | 19.75 | — | — |

[1]Parts by weight of resin per 100 parts by weight of resin and polymer combined.
[2]B denotes a broken joint and — denotes a value exceeding 2 × 10$^8$ mΩ.
[3]— denotes a value exceeding 1 × 10$^5$ mΩ·cm.

That which is claimed is:
1. A silicone composition, comprising:
(A) 20 to 45 parts by weight of a polydiorganosiloxane having the formula:

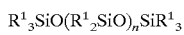

$R^1{}_3SiO(R^1{}_2SiO)_nSiR^1{}_3$ wherein each $R^1$ is independently a monovalent aliphatic hydrocarbon group or a monovalent halogenated aliphatic hydrocarbon group, n has a value such that the polydiorganosiloxane has a viscosity from 0.1 to 200 Pa·s at 25° C., and the polydiorganosiloxane contains an average of at least two alkenyl groups per molecule;
(B) 55 to 80 parts by weight of an organopolysiloxane resin consisting essentially of $R^2{}_3SiO_{1/2}$ siloxane units and $SiO_{4/2}$ siloxane units wherein each $R^2$ is independently alkyl or alkenyl, the mole ratio of $R^2{}_3SiO_{1/2}$ units to $SiO_{4/2}$ units is from 0.65 to 1.9, the resin contains an average of from about 3 to 30 mole percent of alkenyl groups, and the total amount of components (A) and (B) is 100 parts by weight;
(C) an organohydrogenpolysiloxane having an average of at least two silicon-bonded hydrogen atoms per molecule in an amount sufficient to cure the composition;
(D) an electrically conductive filler in an amount sufficient to impart electrical conductivity to the composition, wherein the filler comprises particles having at least an outer surface of a metal selected from the group consisting of silver, gold, platinum, palladium, and alloys thereof; and
(E) a catalytic amount of a hydrosilylation catalyst.
2. The silicone composition according to claim 1, wherein the polydiorganosiloxane is a dimethylvinylsiloxy-terminated polydimethylsiloxane.
3. The silicone composition according to claim 1, wherein the organopolysiloxane resin consists essentially of $(CH_3)_3SiO_{1/2}$ units, $CH_2=CH(CH_3)_2SiO_{1/2}$ units, and $SiO_{4/2}$ units.

4. The silicone composition according to claim 1, wherein the mole ratio of $R^2_3SiO_{1/2}$ units to $SiO_{4/2}$ units in the organopolysiloxane resin is from 0.9 to 1.8.

5. The silicone composition according to claim 1, wherein the organopolysiloxane resin contains an average of from 5 to 15 mole percent of alkenyl groups.

6. The silicone composition according to claim 1, wherein the organohydrogenpolysiloxane has a concentration sufficient to provide from 1 to 2 silicon-bonded hydrogen atoms per alkenyl group in components (A) and (B) combined.

7. The silicone composition according to claim 1, wherein the filler comprises particles consisting of silver, gold, platinum, palladium, or alloys thereof.

8. The silicone composition according to claim 7, wherein the particles have the form of powder or flakes.

9. The silicone composition according to claim 8, wherein the particles are flakes consisting of silver.

10. The silicone composition according to claim 1, wherein the filler has a concentration from about 15 to about 50 percent by volume, based on the total volume of the composition.

11. The silicone composition according to claim 1, wherein the hydrosilylation catalyst comprises platinum.

12. The silicone composition according to claim 11, wherein the hydrosilylation catalyst is a microencapsulated platinum catalyst.

13. The silicone composition according to claim 1, wherein the composition further comprises an adhesion promoter.

14. The silicone composition according to claim 13, wherein the adhesion promoter is an organopentasiloxane having the formula:

$$AMe_2Si(OMe_2Si)_3OSiR^7_{4-e}(OR^7)_{e-1}$$

wherein A is hydrogen or an aliphatically unsaturated monovalent hydrocarbon group, $R^7$ is alkyl, and e is an integer from 2 to 4.

15. The silicone composition according to claim 14, wherein the organopentasiloxane has the formula $ViMe_2SiO(Me_2SiO)_3Si(OMe)_3$.

16. A silicone adhesive comprising a reaction product of the composition of claim 1.

17. A silicone adhesive comprising a reaction product of the composition of claim 4.

18. A silicone adhesive comprising a reaction product of the composition of claim 9.

19. A multi-part silicone composition, comprising:
(A) 20 to 45 parts by weight of a polydiorganosiloxane having the formula:

$$R^1_3SiO(R^1_2SiO)_nSiR^1_3$$

wherein each $R^1$ is independently a monovalent aliphatic hydrocarbon group or a monovalent halogenated aliphatic hydrocarbon group, n has a value such that the polydiorganosiloxane has a viscosity from 0.1 to 200 Pa·s at 25° C., and the polydiorganosiloxane contains an average of at least two alkenyl groups per molecule;

(B) 55 to 80 parts by weight of an organopolysiloxane resin consisting essentially of $R^2_3SiO_{1/2}$ siloxane units and $SiO_{4/2}$ siloxane units wherein each $R^2$ is independently alkyl or alkenyl, the mole ratio of $R^2_3SiO_{1/2}$ units to $SiO_{4/2}$ units is from 0.65 to 1.9, the resin contains an average of from about 3 to 30 mole percent of alkenyl groups, and the total amount of components (A) and (B) is 100 parts by weight;

(C) an organohydrogenpolysiloxane having an average of at least two silicon-bonded hydrogen atoms per molecule in an amount sufficient to cure the composition;

(D) an electrically conductive filler in an amount sufficient to impart electrical conductivity to the composition, wherein the filler comprises particles having at least an outer surface of a metal selected from the group consisting of silver, gold, platinum, palladium, and alloys thereof; and (E) a catalytic amount of a hydrosilylation catalyst, provided neither component (A) nor component (B) are present with components (C) and (E) in the same part.

20. A composition comprising:
(A) a polydiorganosiloxane having the formula:

$$R^1_3SiO(R^1_2SiO)_nSiR^1_3$$

wherein each $R^1$ is independently a monovalent aliphatic hydrocarbon group or a monovalent halogenated aliphatic hydrocarbon group, n has a value such that the polydiorganosiloxane has a viscosity from 0.1 to 200 Pa·s at 25° C., and the polydiorganosiloxane contains an average of at least two alkenyl groups per molecule;

(B) an organopolysiloxane resin consisting essentially of $R^2_3SiO_{1/2}$ siloxane units and $SiO_{4/2}$ siloxane units wherein each $R^2$ is independently alkyl or alkenyl, the mole ratio of $R^2_3SiO_{1/2}$ units to $SiO_{4/2}$ units is from 0.65 to 1.9, the resin contains an average of from about 3 to 30 mole percent of alkenyl groups, and the total amount of components (A) and (B) is 100 parts by weight;

(C) an organohydrogenpolysiloxane having an average of at least two silicon-bonded hydrogen atoms per molecule in an amount sufficient to cure the composition;

(D) an electrically conductive filler in an amount sufficient to impart electrical conductivity to the composition, wherein the filler comprises particles having at least an outer surface of a metal selected from the group consisting of silver, gold, platinum, palladium, and alloys thereof; and (E) a catalytic amount of a hydrosilylation catalyst; wherein the organopolysiloxane resin has a concentration of 55 to 90 parts by weight per 100 parts by weight of components (A) and (B) combined.

* * * * *